United States Patent
Watanabe

(10) Patent No.: US 10,451,262 B2
(45) Date of Patent: Oct. 22, 2019

(54) LIGHT EMITTING APPARATUS

(71) Applicant: HOYA CANDEO OPTRONICS CORPORATION, Toda-shi, Saitama (JP)

(72) Inventor: Hiroaki Watanabe, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 16/163,974

(22) Filed: Oct. 18, 2018

(65) Prior Publication Data

US 2019/0128511 A1    May 2, 2019

(30) Foreign Application Priority Data

Oct. 27, 2017    (JP) .................................. 2017-207803

(51) Int. Cl.
*F21V 29/67*    (2015.01)
*F21V 29/70*    (2015.01)
(Continued)

(52) U.S. Cl.
CPC .......... *F21V 29/673* (2015.01); *F21V 29/505* (2015.01); *F21V 29/70* (2015.01); *F21V 29/763* (2015.01); *F21V 29/83* (2015.01); *H01L 33/483* (2013.01); *H01L 33/642* (2013.01); *H05K 7/20145* (2013.01); *H05K 7/20154* (2013.01); *F21Y 2103/10* (2016.08); *F21Y 2115/10* (2016.08)

(58) Field of Classification Search
CPC ...... F21V 29/673; F21V 29/505; F21V 29/70; F21V 29/763; F21V 29/83; B05D 3/061; F26B 3/283; G03F 7/70058; G03F 7/702; G03F 7/70033; G03F 7/7005; G03F 7/201; H01L 33/483; H01L 33/642; H05K 7/20145; H05K 7/20154
See application file for complete search history.

(56) References Cited

U.S. PATENT DOCUMENTS

| | | | | |
|---|---|---|---|---|
| 8,313,221 B2* | 11/2012 | Hsu | ......................... | F21V 29/02 362/218 |
| 2004/0120152 A1* | 6/2004 | Bolta | ..................... | F21V 29/67 362/294 |

(Continued)

FOREIGN PATENT DOCUMENTS

| | | |
|---|---|---|
| JP | 2013-252720 A | 12/2013 |
| JP | 2016-013548 A | 1/2016 |

*Primary Examiner* — Alan B Cariaso
(74) *Attorney, Agent, or Firm* — Rabin & Berdo, P.C.

(57) ABSTRACT

Provided is a small-sized light emitting apparatus having a configuration capable of uniformly cooling multiple LEDs. A light emitting apparatus, which emits linear light, includes: a light source unit which has multiple light sources that are disposed on a surface of a substrate in parallel in a first direction; a heat dissipation unit which has multiple heat radiation fins formed in the first direction, and is thermally coupled to a rear side of the substrate; a partition plate which forms a first air channel surrounding the multiple heat radiation fins; a housing which forms a second air channel between the housing and the partition plate; and a cooling fan which receives air from the outside, guides the air to the second air channel, and forms an airflow in the first direction.

11 Claims, 6 Drawing Sheets

(51) Int. Cl.
  *H01L 33/64*   (2010.01)
  *F21V 29/83*   (2015.01)
  *H01L 33/48*   (2010.01)
  *H05K 7/20*    (2006.01)
  *F21V 29/505*  (2015.01)
  *F21V 29/76*   (2015.01)
  *G03F 7/20*    (2006.01)
  *F21Y 103/10*  (2016.01)
  *F21Y 115/10*  (2016.01)

(56) References Cited

U.S. PATENT DOCUMENTS

2007/0091632 A1\* 4/2007 Glovatsky ............ B60Q 1/0052
                                                         362/547
2011/0063832 A1\* 3/2011 Hu ..................... F21V 29/74
                                                         362/235
2013/0343044 A1\* 12/2013 Kim ..................... F21S 9/03
                                                         362/183
2015/0198321 A1\* 7/2015 Druchinin .......... H05B 33/0803
                                                         362/235
2017/0191650 A1\* 7/2017 Kobayashi ............ F21V 29/503

\* cited by examiner (a)

(b)

(a)

(b)

LIGHT EMITTING APPARATUS

TECHNICAL FIELD

The present invention relates to a light emitting apparatus having light emitting diodes (LEDs) as a light source and emits linear light, and particularly, to a light emitting apparatus having a heat dissipation member that dissipates heat generated from the LEDs.

BACKGROUND ART

In the related art, ultraviolet curable ink, which is cured by being irradiated with ultraviolet rays, is used as ink to be printed on a container such as a beer can, a juice can, a PET bottle, a shampoo bottle, or a cosmetic bottle. Further, a light emitting apparatus, which emits the ultraviolet rays, is generally used to cure the ultraviolet curable ink.

For example, Patent Document 1 discloses an image forming apparatus for forming an image on an outer circumferential surface of a can body (irradiation object) by using an inkjet head. The apparatus has a support cylinder (mandrel) which is inserted into the can body and supports the can body, the inkjet head which discharges ultraviolet curable ink onto the outer circumferential surface of the can body supported by the support cylinder, a UVLED lamp (light emitting apparatus), and the like. Further, the ultraviolet curable ink is discharged while the can body is rotated such that an image is formed on the outer circumferential surface of the can body, and the outer circumferential surface of the can body is irradiated with ultraviolet rays from the UVLED lamp such that the ultraviolet curable ink attached onto the outer circumferential surface of the can body is cured.

Patent Document 2 discloses a printing device including a transport unit which transports a print medium, six heads which are arranged in a transport direction and discharge cyan ink, magenta ink, yellow ink, black ink, orange ink, and green ink, respectively, six irradiation units (light emitting apparatuses) for temporary curing which are disposed at a downstream side in the transport direction between the respective heads and temporarily cure (pinning) dotted ink discharged onto the print medium from the respective heads, and an irradiation unit for main curing which mainly cures the dot ink and fixes the dot ink onto the print medium. Further, LEDs are used, as a light source, for the irradiation unit for temporary curing to meet requirements of reduction in weight and size of the printing device itself, and the multiple LEDs are disposed in parallel in a width direction of the print medium.

DOCUMENT OF RELATED ART

Patent Document

[Patent Document 1]
Japanese Patent Application Laid-Open No. 2016-013548
[Patent Document 2]
Japanese Patent Application Laid-Open No. 2013-252720

SUMMARY OF THE INVENTION

When the LEDs are used as a light source like the light emitting apparatuses disclosed in Patent Documents 1 and 2, most of the inputted electric power is converted into heat, and as a result, there is a problem in that emission efficiency and a lifespan are decreased due to heat generated from the LEDs. In addition, the light emitting apparatus itself (i.e., a housing) is also heated by the heat generated from the LEDs, and as a result, there is also a problem in that components cannot be disposed in proximity to the periphery of the light emitting apparatus, such that an overall size of the light emitting apparatus is increased.

These problems become further serious in the case of the apparatus mounted with the multiple LEDs, like the light emitting apparatus of Patent Document 2, because the number of LEDs acting as heat sources is increased. In addition, even in the case in which the UVLED is used as a light source, like the light emitting apparatuses of Patent Documents 1 and 2, the amount of heat generated from the LED itself is increased, and as a result, the problems also become similarly serious. For this reason, the light emitting apparatus, which uses the LED as a light source, adopts a configuration that generally uses a heat dissipation member such as a heat sink to inhibit the LED from generating heat.

As described above, it is effective to use the heat dissipation member such as the heat sink so as to inhibit the LED from generating heat. However, in the case of the configuration in which the multiple LEDs are disposed in parallel like the light emitting apparatus of Patent Document 2, if the respective LEDs are not uniformly cooled (i.e., if a temperature is not approximately uniform), a light amount becomes irregular due to a temperature difference between the respective LEDs, and ultraviolet curable ink on an irradiation object is also irregularly cured. In the present specification, a state in which a temperature is approximately uniform means a state in which a temperature difference is present to the extent that no problem occurs when actually using a light emitting apparatus of the present invention, and for example, means a state in which a temperature difference is 10° C. or less.

The present invention has been made in consideration of the aforementioned circumstances, and an object of the present invention is to provide a small-sized light emitting apparatus having a configuration capable of uniformly cooling multiple LEDs while inhibiting a housing from generating heat.

To achieve the object, the present invention provides a light emitting apparatus which emits, onto an irradiation surface, linear light that extends in a first direction and has a predetermined line width in a second direction orthogonal to the first direction, the light emitting apparatus including: a light source unit which has a substrate that extends in the first direction, and multiple light sources that are disposed on a surface of the substrate in parallel in the first direction; a heat dissipation unit which has multiple heat radiation fins that are formed at predetermined intervals in the first direction, and is thermally coupled to a rear side of the substrate; a partition plate which forms a first air channel surrounding the multiple heat radiation fins; a housing which accommodates the light source unit, the heat dissipation unit, and the partition plate and forms a second air channel between the housing and the partition plate; and a cooling fan which receives air from the outside, guides the air to the second air channel, and forms an airflow in the first direction in the second air channel, in which the partition plate has a communication port formed to be in communication with the first air channel and the second air channel, the housing continues from the first air channel and has a gas discharge port through which the air in the first air channel is discharged to the outside, and the air, which is guided in the first direction in the second air channel, is guided into the first air channel through the communication port, passes between the multiple heat radiation fins, and is discharged to the outside from the gas discharge port.

With this configuration, the amounts of air passing and flowing between the respective heat radiation fins are approximately equal to one another (i.e., air speeds are approximately equal to one another), and as a result, the heat dissipation unit is uniformly cooled. Therefore, temperatures of the multiple light sources are approximately equal to one another, and irregularity of light amount is inhibited.

The housing may have, between the second air channel and the cooling fan, a third air channel which is in communication with the second air channel. In addition, in this case, a drive circuit, which is electrically connected to the light source unit and supplies electric power to the multiple light sources, may be provided in the third air channel. With this configuration, the light source and the drive circuit may be cooled by the cooling fan.

The light emitting apparatus may further include a reflective member which guides the light, which is emitted from the multiple light sources, to the outside of the housing, in which the reflective member is thermally coupled to a part of the housing, and the part of the housing forms a part of the second air channel.

A ratio between a cross-sectional area of the second air channel in the second direction and an opening area of the communication port may be set to 1:1 to 1:2.

An opening area of the gas discharge port may be larger than the opening area of the communication port.

The gas discharge port may be provided in a wall portion of the housing which is positioned in a direction opposite to an emission direction of light emitted from the multiple light sources.

The gas discharge port may be formed in a wall portion of the housing which is positioned in the second direction.

The gas discharge port may be provided in a wall portion of the housing which is orthogonal to the first direction.

The first air channel may be partitioned into a first sub-space which is formed in the first direction and at least accommodates the heat dissipation unit, and a second sub-space which is positioned in parallel with the first sub-space in a direction opposite to the emission direction of the light emitted from the multiple light sources and is in communication with the first sub-space and the gas discharge port.

The light may be light including a wavelength acting on ultraviolet curable resin.

As described above, according to the present invention, the small-sized light emitting apparatus capable of uniformly cooling the multiple LEDs while inhibiting the housing from being heated is realized.

DETAILED DESCRIPTION

Figure 1:
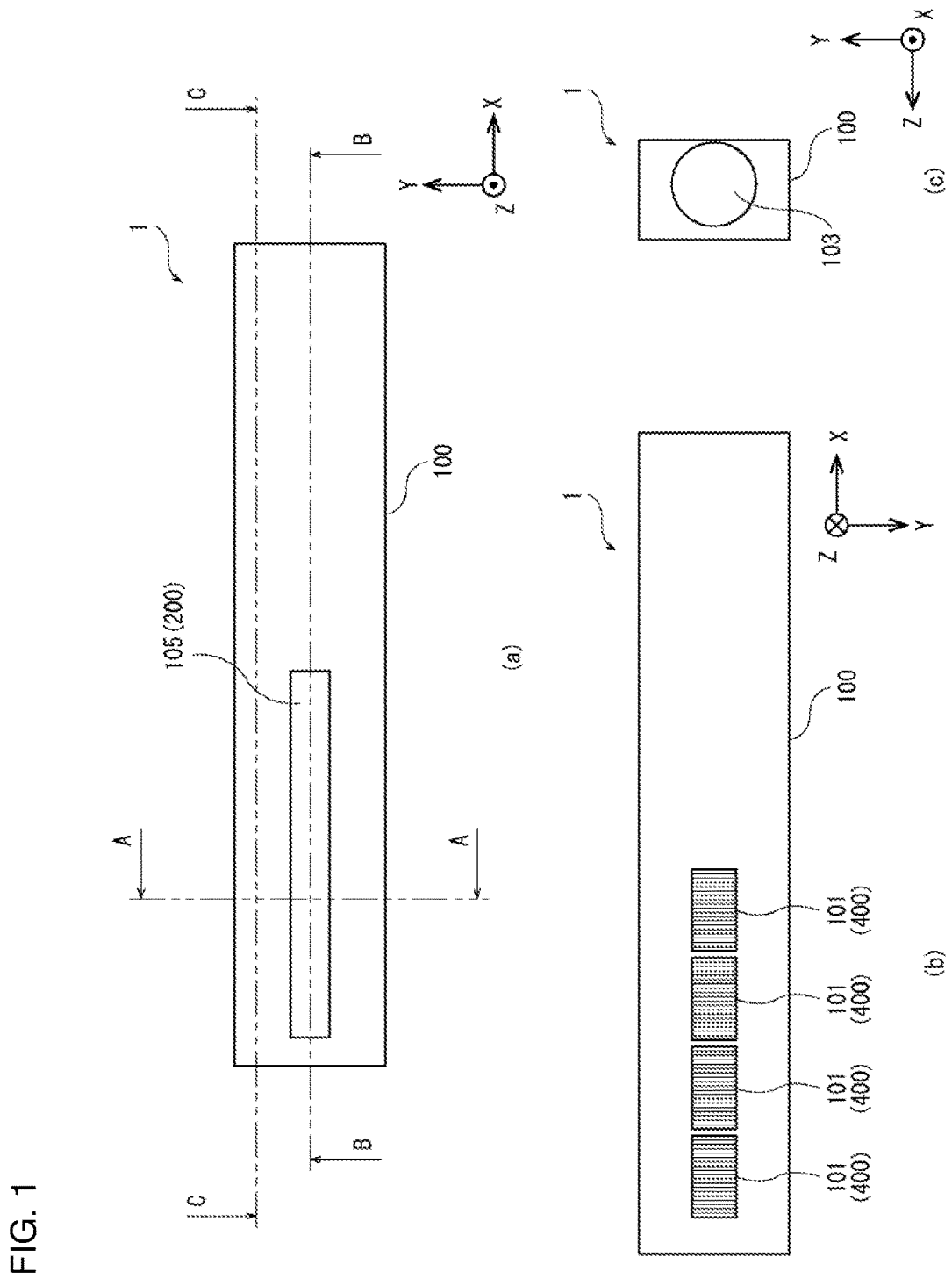
FIG. 1 is a view illustrating an external appearance of a light emitting apparatus according to a first exemplary embodiment of the present invention.

Hereinafter, exemplary embodiments of the present invention will be described in detail with reference to the drawings. Further, in the drawings, the same or corresponding constituent elements are designated by the same reference numerals, and repetitive descriptions of thereof will be omitted.

First Exemplary Embodiment

FIG. 1 is a view illustrating an external appearance of a light emitting apparatus 1 according to a first exemplary embodiment of the present invention, and FIG. 1A is a front view of the light emitting apparatus 1. In addition, FIG. 1B is a rear view of the light emitting apparatus 1, and FIG. 1C is a right side view of the light emitting apparatus 1. The light emitting apparatus 1 of the present exemplary embodiment is a light source apparatus which is mounted in a printing device or the like and cures ultraviolet curable ink or ultraviolet curable resin, and for example, the light emitting apparatus 1 is disposed above an irradiation object and emits linear ultraviolet rays to the irradiation object. Further, in the present specification, as illustrated in a coordinate in FIG. 1, the description will be made in a state in which a direction in which light emitting diode (LED) elements 210 to be described below emit the ultraviolet rays is defined as a Z-axis direction, a direction in which the LED elements 210 are arranged is defined as an X-axis direction, and a direction which is orthogonal to the Z-axis direction and the X-axis direction is defined as a Y-axis direction.

As illustrated in FIG. 1, the light emitting apparatus 1 of the present exemplary embodiment has a box-shaped housing 100 which is elongated in the X-axis direction and accommodates therein a light source unit 200, a heat dissipation member 400, and the like. The housing 100 has a window 105 which is provided at a front side of the housing 100 and made of glass to allow the ultraviolet ray to exit the housing 100. In addition, gas discharge ports 101, through which air in the housing 100 is discharged, are formed at a rear side of the housing 100, and a cooling fan 103, which supplies air into the housing 100, is disposed at a right side of the housing 100. In addition, a connector (not illustrated) for supplying electric power to the light emitting apparatus 1, is provided at the rear side of the housing 100, and the connector (not illustrated) is electrically connected to a power supply device (not illustrated), such that electric power is supplied to the light emitting apparatus 1.

Figure 2:
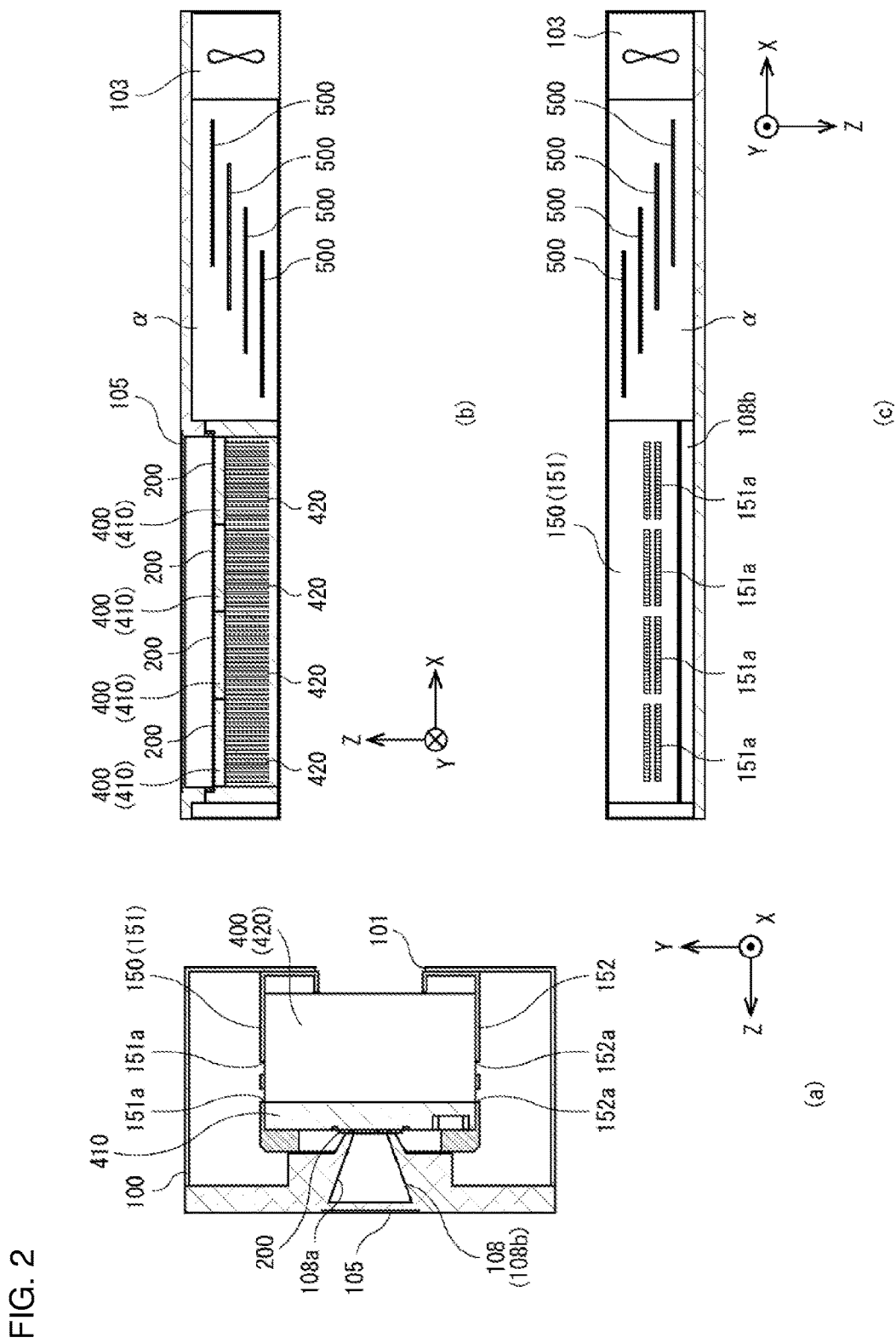
FIG. 2 is a view for explaining an internal configuration of the light emitting apparatus according to the first exemplary embodiment of the present invention.

FIG. 2 is a view for explaining an internal configuration of the light emitting apparatus 1 according to the exemplary embodiment of the present invention, FIG. 2A is a cross-sectional view taken along line A-A in FIG. 1, FIG. 2B is a cross-sectional view taken along line B-B in FIG. 1, and FIG. 2C is a cross-sectional view taken along line C-C in FIG. 1. Further, in FIG. 2, some configurations such as a wire cable in the light emitting apparatus 1 are omitted to facilitate viewing of FIG. 2.

As illustrated in FIG. 2, the light emitting apparatus 1 of the present exemplary embodiment has, in the housing 100, the four light source units 200 which are disposed in parallel in the X-axis direction, the four heat dissipation members 400 which are disposed in parallel in the X-axis direction, and four LED drive circuits 500 which are disposed at an approximately constant interval in the Z-axis direction. Further, the respective light source units 200, the respective heat dissipation members 400, the respective LED drive circuits 500 have completely the same configurations, respectively. Further, as illustrated in FIGS. 2B and 2C, in the present exemplary embodiment, the light source units 200 and the heat dissipation members 400 are disposed in the housing 100 near a side in a direction opposite to the X-axis direction, and the LED drive circuits 500 are disposed in a space α between the cooling fan 103 and a space in which the light source units 200 and the heat dissipation members 400 are disposed.

Figure 3:
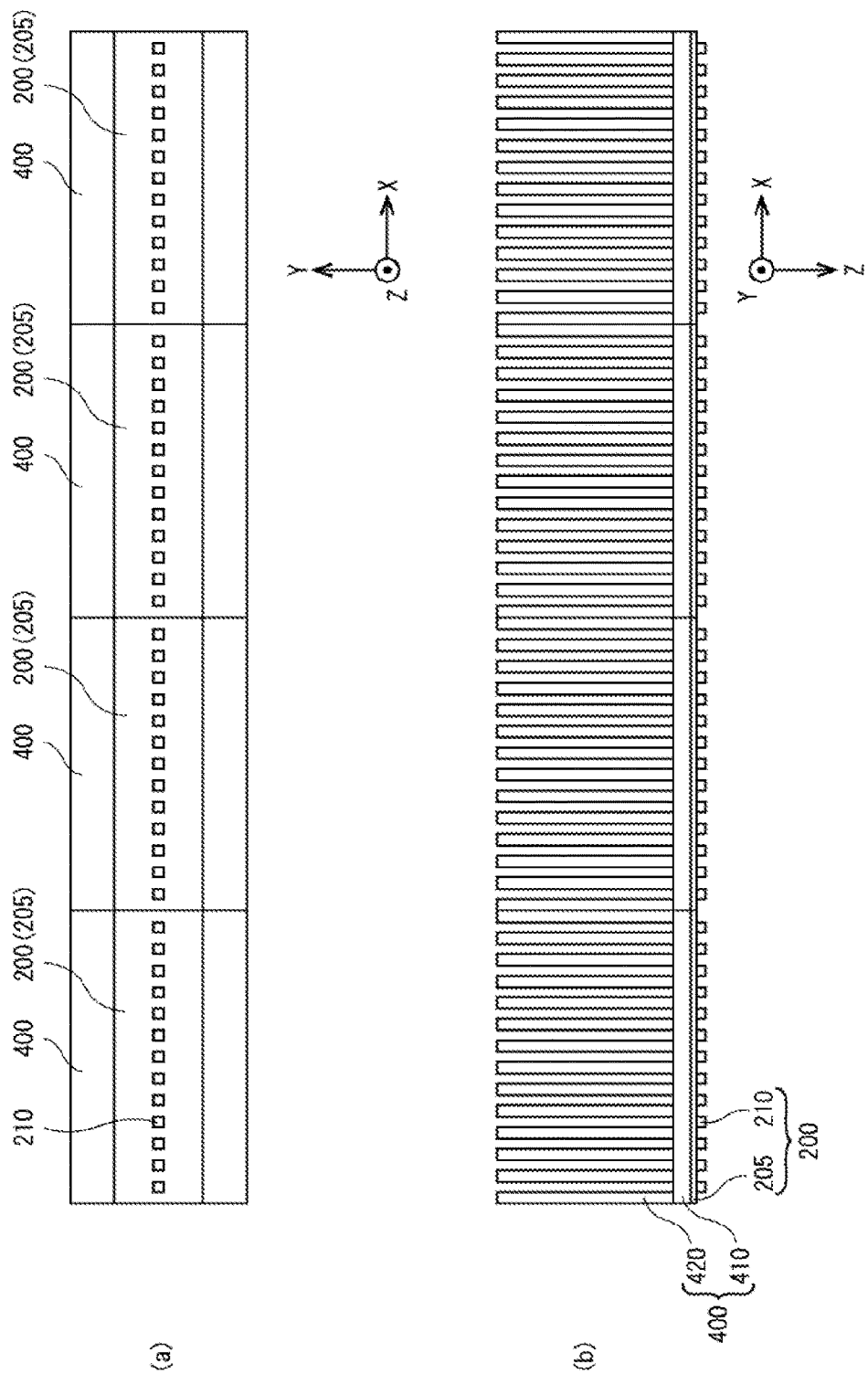
FIG. 3 is a schematic view for explaining configurations of a light source unit and a heat dissipation member provided in the light emitting apparatus according to the first exemplary embodiment of the present invention.

FIG. 3 is a schematic view for explaining the configurations of the light source unit 200 and the heat dissipation member 400 of the present exemplary embodiment, FIG. 3A is a front view viewed in the Z-axis direction, and FIG. 3B is a top plan view viewed in the Y-axis direction. As illustrated in FIG. 3, the light source unit 200 has a substrate 205 in the form of a rectangular plate parallel to the X-axis direction and the Y-axis direction, and the multiple LED elements 210 (for example, the number of LED elements is 10) having the same property, and the light source unit 200 is fixed onto one end surface (end surface in the Z-axis direction) of a heat dissipation plate 410 of the heat dissipation member 400.

The multiple LED elements 210 are arranged in a line on a surface of the substrate 205 at predetermined intervals in the X-axis direction in a state in which an optical axis is aligned in the Z-axis direction, and the multiple LED elements 210 are electrically connected to the substrate 205. In addition, the substrates 205 are electrically connected to one another by wire cables (not illustrated) extending from the LED drive circuits 500, and a drive current is supplied to each of the LED elements 210 from each of the LED drive circuits 500. When the drive current is supplied to each of the LED elements 210, an ultraviolet ray (for example, having a wavelength of 365 nm) having a light amount in accordance with the drive current is emitted from each of the LED elements 210, such that a linear ultraviolet ray, which extends in the X-axis direction and has a predetermined line width in the Y-axis direction orthogonal to the X-axis direction, is emitted from the light source unit 200. As illustrated in FIG. 3, in the present exemplary embodiment, the four light source units 200 are disposed in parallel in the X-axis direction, and the linear ultraviolet ray emitted from each of the light source units 200 is continuous in the X-axis direction.

The heat dissipation member 400 is a member for dissipating heat generated from the light source unit 200. The heat dissipation member 400 of the present exemplary embodiment includes a heat dissipation plate 410 which is made of metal (e.g., copper or aluminum) and has a rectangular plate shape, and multiple heat radiation fins 420 which are brazed on the other end surface of the heat dissipation plate 410 (a surface opposite to the surface on which the light source unit 200 is mounted) (FIGS. 2A and 3B). The heat radiation fin 420 is a member which is made of metal (e.g., metal such as copper, aluminum, iron, or magnesium or an alloy including these materials), stands and protrudes in the direction opposite to the Z-axis direction from the heat dissipation plate 410, dissipates heat transferred to the heat dissipation plate 410 into the air, and has a rectangular plate shape. Further, as described below in detail, in the present exemplary embodiment, air is introduced into the housing 100 from the outside by the cooling fan 103, and an airflow is generated such that the introduced air flows along the surface of each of the heat radiation fins 420, and as a result, air heated by the heat radiation fins 420 is quickly discharged through the gas discharge ports 101.

As illustrated in FIG. 2A, the light source units 200 and the heat dissipation members 400 of the present exemplary embodiment are accommodated and fixed in an inner casing 150 fixed at an approximately center portion in the Y-axis direction in the housing 100. The inner casing 150 is a hollow member which extends in the X-axis direction and has a rectangular cross-sectional shape, and the inner casing 150 is configured such that when the light source units 200 and the heat dissipation members 400 are fixed in the inner casing 150, the respective LED elements 210 are disposed at positions facing the window 105. In addition, as illustrated in FIG. 2A, in the present exemplary embodiment, a reflective member 108 is provided between the light source unit 200 and the window 105. The reflective member 108 includes mirror surfaces 108a and 108b fixed in the housing 100 so as to surround optical paths of the LED elements 210, and each of the mirror surfaces 108a and 108b is disposed to be gradually widened in an emission direction (i.e., Z-axis direction) of an ultraviolet ray. Further, the mirror surfaces 108a and 108b, which are disposed as described above, regulate the optical path of the ultraviolet ray which is emitted from each of the LED elements 210 at a predetermined spread angle, and the mirror surfaces 108a and 108b guide the ultraviolet ray so that the ultraviolet ray having predetermined intensity passes through the window 105 and reaches a desired irradiation region approximately perpendicularly to the desired irradiation region. Further, in the case of the respective LED elements 210 of the present exemplary embodiment, the drive current to be supplied to each of the LED elements 210 is adjusted to emit the ultraviolet ray with approximately the same light amount, and the linear ultraviolet ray emitted from the light source unit 200 has an approximately uniform light amount distribution in the X-axis direction.

When the drive current flows to each of the LED elements 210 and thus the ultraviolet ray is emitted from each of the LED elements 210, a temperature is increased due to self-heating of the LED element 210, but the heat generated from each of the LED elements 210 is quickly transferred (moved) to the heat radiation fins 420 through the substrate 205 and the heat dissipation plate 410 and then dissipated into the peripheral air from the respective heat radiation fins 420. Further, the air heated by the heat radiation fins 420 is quickly discharged through the gas discharge ports 101 by the airflow flowing along the surfaces of the respective heat radiation fins 420.

Here, in the configuration of the present exemplary embodiment, the four light source units 200 and the four heat dissipation members 400 are disposed in parallel in the X-axis direction, such that irregularity of light amount occurs when the LED elements 210 of the respective light source units 200 have different temperatures, and as a result, there was a problem in that in order to uniformize the light amount, it is necessary to uniformly cool the four heat dissipation members 400 disposed at different distances from the fan. Therefore, to solve the problem, in the present exemplary embodiment, the inner casing 150 accommodates the light source units 200 and the heat dissipation members 400, two partition plates 151 and 152 are disposed to face each other in the Y-axis direction to partition an inner space and outer space of the inner casing 150, and air flows between the respective heat radiation fins 420 through communication ports 151a and 152a formed in the two partition plates 151 and 152. Therefore, the amounts (i.e., air speeds) of air flowing between the respective heat dissipation members 400 may be approximately equal to one another, such that the four heat dissipation members 400 may be uniformly cooled.

As illustrated in FIGS. 2A and 2C, in the present exemplary embodiment, the communication ports 151a are provided in two rows in the Z-axis direction, the communication ports 152a are provided in two rows in the Z-axis direction, and the communication ports 151a and 152a are provided in four rows in the X-axis direction. In the present exemplary embodiment, shapes of the communication ports 151a and 152a are not particularly limited as long as the communication ports 151a and 152a allow the interior and the exterior of the inner casing 150 to be in communication with each other and the communication ports 151a and 152a have predetermined communication port opening areas, and each of the communication ports 151a and 152a may have any shape. In addition, each of the communication ports 151a and 152a may have a longitudinal direction in the direction perpendicular to the direction in which the heat radiation fins 420 stand. Since the communication ports 151a and 152a have the aforementioned configurations, it is possible to allow air to more effectively flow between the heat radiation fins. Further, in this case, it is better if a length in the longitudinal direction of each of the communication ports 151a and 152a is increased, and for example, a single communication port 151a may be provided over the partition plate 151, and a single communication port 152a may be provided over the partition plate 152.

Figure 4:
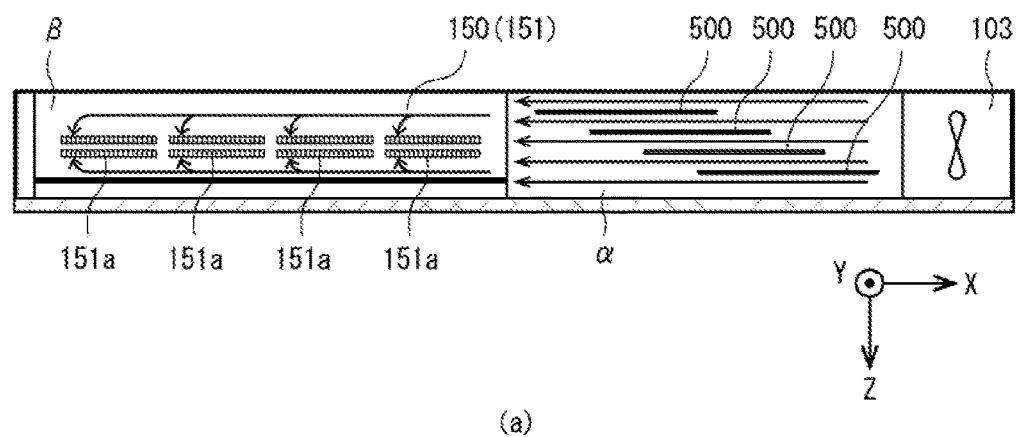
FIG. 4 is a schematic view for explaining a relationship between the heat dissipation member provided in the light emitting apparatus according to the first exemplary embodiment of the present invention and an airflow generated in a housing.
Figure 4:
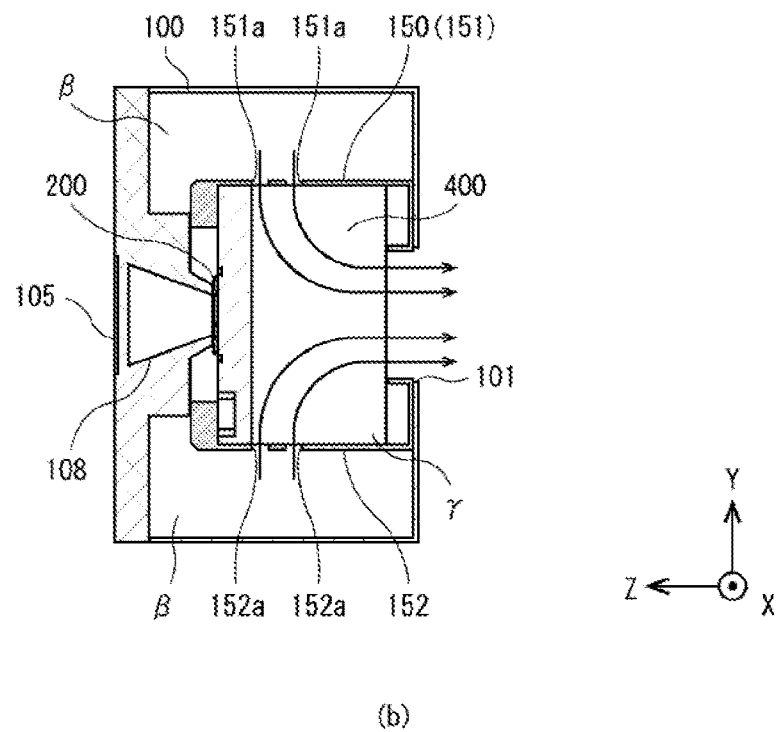

Hereinafter, a cooling operation of the heat dissipation member 400, which is the feature of the present invention, will be described. FIG. 4 is a schematic view for explaining a relationship between the heat dissipation member 400 and an airflow generated in the housing 100. Further, FIG. 4A is a view in which the arrows for indicating directions of the airflow are added to FIG. 2C, and FIG. 4B is a view in which the arrows for indicating the airflow are added to FIG. 2A.

As illustrated in FIG. 4, the light emitting apparatus 1 of the present exemplary embodiment has the cooling fan 103 provided at the right side of the housing 100, and the gas discharge ports 101 are formed at the rear side of the housing 100. Therefore, when the cooling fan 103 rotates, air outside the housing 100 is introduced from the cooling fan 103, and positive pressure is formed in the housing 100, such that air inside the housing 100 is discharged from the gas discharge port 101. Therefore, the airflow, which is indicated by the solid arrows in FIG. 4A, is generated in the housing 100. That is, the air introduced into the housing 100 from the cooling fan 103 passes between the respective LED drive circuits 500 in the space α in the housing 100 in which the LED drive circuits 500 are disposed, such that the air flows in the direction opposite to the X-axis direction. For this reason, heat generated from the respective LED drive circuits 500 is dissipated into the air flowing in the space α. In this way, in the present exemplary embodiment, the space α in the housing 100, in which the LED drive circuits 500 are disposed, is configured as a kind of air channel (third air channel), thereby cooling the respective LED drive circuits 500.

As illustrated in FIG. 4A, the air, which has passed through the space α, then moves into a space β surrounded by the inner casing 150 and the housing 100. Here, with the presence of the inner casing 150, a cross-sectional area of the space β in the Y-Z plane is smaller than a cross-sectional area of the space α. In the present specification, the cross-sectional area of the space β in the Y-Z plane (i.e., a cross-sectional area of the space β in the X-direction) particularly means a total sum of cross sections of one or two or more spaces surrounded by the inner casing 150 and the housing 100 in the Y-Z cross section of the housing 100 including the inner casing 150, and for example, in FIG. 4B, the cross-sectional area of the space β in the Y-Z plane means a sum of a cross-sectional area of the space β illustrated at an upper side of the inner casing (a plus side of the Y axis) and a cross-sectional area of the space β illustrated at a lower side thereof (a minus side of the Y axis).

The air, which has moved into the space β, passes through the communication ports 151a and 152a formed in the partition plates 151 and 152 of the inner casing 150 and flows between the respective heat radiation fins 420, but the direction of the airflow is bent at 90 degrees, such that the air pressure in the space β is increased, and the air speed is decreased. For this reason, the amounts of air introduced into the respective communication ports 151a and 152a from the space β (i.e., an air speed of air introduced into a space γ surrounded by the inner casing 150) become approximately uniform, and the air having approximately uniform amount flows along the surfaces of the heat radiation fins 420 of the respective heat dissipation members 400 and is discharged through the gas discharge ports 101. For this reason, the respective heat dissipation members 400 are approximately uniformly cooled. Further, the air, which has passed through the communication ports 151a and 152a, is introduced into the space γ, and because the space γ has a larger volume than the space β, the air pressure decreases and the air speed of the introduced air increases in the space γ. Then, the air, which is introduced from the communication ports 151a and 152a provided in the surfaces of the inner casing 150 which face each other, collides with each other at the center of the space γ, and as a result, a turbulent airflow is generated in the vicinity of the center of the space γ. In this way, since the communication ports 151a and 152a are provided in the surfaces of the inner casing 150 which face each other, it is possible to generate the turbulent airflow in the space γ and perform efficient cooling in which the air convolutes more widely.

In this way, the space β surrounded by the inner casing 150 and the housing 100 of the present exemplary embodiment also functions as a kind of air channel (second air channel), and the space γ surrounded by the inner casing 150 also functions as a kind of air channel (first air channel). Further, in the present exemplary embodiment, a ratio of the communication port opening area to the cross-sectional area of the space β in the Y-Z plane is set to 1:1 to 1:2, and a sum of opening areas of the multiple gas discharge ports 101 illustrated in FIG. 1 is set to be sufficiently greater than the communication port opening area. In the present specification, the sum of the opening areas of all of the communication ports 151a and 152a provided in the partition plates 151 and 152 (in the example in FIG. 4, the total sum of the opening areas of the total of sixteen communication ports 151a and 152a including the eight communication ports 151a illustrated in FIG. 4C and the non-illustrated eight communication ports 152a at the rear side) is referred to as the "communication port opening area".

Tables 1 to 6 are tables for explaining results of simulations performed on the relationship between the cross-sectional area of the space β in the Y-Z plane and the communication port opening area, in terms of a temperature of the heat dissipation member 400 and an air speed in the gas discharge port 101.

Tables 1 to 3 show the results of the simulations which were performed while changing conditions (the communication port opening area, a blow rate of the cooling fan 103, etc.) in accordance with Examples a-1 to a-10 and Comparative Examples a-1 and a-2, as shown in Table 1, in a case in which it was assumed that the cross-sectional area of the space β in the Y-Z plane (shown as an air channel cross-sectional area in the Tables) was 4,000 mm². In Comparative Example a-1 and a-2, the light emitting apparatus 1 had the structure in which no inner casing 150 was provided, that is, neither space γ nor space β (i.e., neither first nor second air channel) was formed. In all of the Examples and the Comparative Examples, the sixteen communication ports 151a and 152a had the same area and the same length of 25 mm in the longitudinal direction. Further, the communication port opening area was adjusted by changing lengths in a transverse direction of the communication ports 151a and 152a.

Tables 4 to 6 show the results of the simulations which were performed while changing conditions (the communication port opening area, a blow rate of the cooling fan 103, etc.) in accordance with Examples b-1 to b-10 and Comparative Examples b-1 and b-2, as shown in Table 4, in a case in which it was assumed that the cross-sectional area of the space β in the Y-Z plane (shown as an air channel cross-sectional area in the Tables) was 6,000 mm². In Comparative Example b-1 and b-2, the light emitting apparatus 1 had the structure in which no inner casing 150 was provided, that is, neither space γ nor space β (i.e., neither first nor second air channel) was formed. In all of the Examples and the Comparative Examples, the sixteen communication ports 151a and 152a had the same area and the same length of 25 mm in the longitudinal direction. Further, the communication port opening area was adjusted by changing lengths in the transverse direction of the communication ports 151a and 152a.

"Temperature of Heat Dissipation Member" shown in Tables 2 and 5 shows the temperature of each of the four heat dissipation members 400. In addition, "Air Speed in Gas Discharge Port" shown in Tables 3 and 6 shows the air speed of each of the four gas discharge ports 101.

TABLE 1

| | Communication port opening area [mm²] | Area ratio Cross section of air channel:Communication port opening area | Cooling fan | |
|---|---|---|---|---|
| | | | Maximum blow rate [m³/min] | Maximum static pressure [Pa] |
| Example a-1 | 2000 | 2:1 | 4.5 | 1,150 |
| Example a-2 | 4000 | 1:1 | | |
| Example a-3 | 6000 | 1:1.5 | | |
| Example a-4 | 8000 | 1:2 | | |
| Example a-5 | 16000 | 1:4 | | |
| Comparative Example a-1 | — | | | |
| Example a-6 | 2000 | 2:1 | 4.0 | 500 |
| Example a-7 | 4000 | 1:1 | | |
| Example a-8 | 6000 | 1:1.5 | | |
| Example a-9 | 8000 | 1:2 | | |
| Example a-10 | 16000 | 1:4 | | |
| Comparative Example a-2 | — | | | |

TABLE 2

| | Temperature of heat dissipation member [° C.] | | | | Average temperature [° C.] | Temperature difference [° C.] |
|---|---|---|---|---|---|---|
| | No. 1 | No. 2 | No. 3 | No. 4 | | |
| Example a-1 | 61.93 | 61.57 | 60.97 | 59.82 | 61.073 | 2.11 |
| Example a-2 | 58.75 | 59.04 | 59.23 | 58.66 | 58.920 | 0.57 |
| Example a-3 | 58.63 | 59.36 | 59.82 | 59.81 | 59.405 | 1.19 |
| Example a-4 | 58.94 | 59.96 | 59.79 | 59.71 | 59.600 | 1.02 |
| Example a-5 | 61.21 | 62.07 | 63.54 | 65.34 | 63.040 | 4.13 |
| Comparative Example a-1 | 63.8 | 67.1 | 76.8 | 80.8 | 72.125 | 17 |
| Example a-6 | 75.52 | 74.03 | 73.51 | 71.42 | 73.620 | 4.1 |
| Example a-7 | 65.9 | 66.38 | 66.55 | 65.51 | 66.085 | 1.04 |
| Example a-8 | 64.77 | 65.43 | 66.18 | 65.8 | 65.545 | 1.41 |
| Example a-9 | 64.87 | 65.61 | 66.34 | 65.85 | 65.668 | 1.47 |
| Example a-10 | 66.27 | 67.41 | 69.67 | 72.14 | 68.873 | 5.87 |
| Comparative Example a-2 | 69.2 | 73.3 | 86.8 | 91.9 | 80.300 | 22.7 |

TABLE 3

| | Air speed in gas discharge port [m/s] | | | | Average air speed [m/s] | Air speed difference [m/s] |
|---|---|---|---|---|---|---|
| | No. 1 | No. 2 | No. 3 | No. 4 | | |
| Example a-1 | 6.419 | 6.508 | 6.514 | 6.524 | 6.491 | 0.105 |
| Example a-2 | 8.754 | 8.136 | 7.464 | 7.464 | 7.955 | 1.29 |
| Example a-3 | 9.638 | 8.897 | 7.569 | 7.387 | 8.373 | 2.251 |
| Example a-4 | 9.627 | 8.908 | 7.705 | 7.527 | 8.442 | 2.1 |
| Example a-5 | 11.324 | 10.682 | 8.182 | 5.122 | 8.828 | 6.202 |
| Example a-6 | 3.682 | 3.675 | 3.599 | 3.509 | 3.616 | 0.173 |
| Example a-7 | 5.546 | 5.137 | 4.82 | 4.83 | 5.083 | 0.726 |
| Example a-8 | 6.273 | 5.793 | 5.058 | 4.941 | 5.516 | 1.332 |
| Example a-9 | 6.39 | 5.876 | 5.076 | 4.978 | 5.580 | 1.412 |
| Example a-10 | 7.669 | 7.262 | 5.61 | 3.67 | 6.053 | 3.999 |

TABLE 4

| | Communication port opening area [mm²] | Area ratio Cross section of air channel:Communication port opening area | Cooling fan | |
|---|---|---|---|---|
| | | | Maximum blow rate [m³/min] | Maximum static pressure [Pa] |
| Example b-1 | 2,000 | 3:1 | 4.5 | 1,150 |
| Example b-2 | 3,000 | 2:1 | | |
| Example b-3 | 6,000 | 1:1 | | |
| Example b-4 | 8,000 | 1:1.5 | | |
| Example b-5 | 16,000 | 1:2.7 | | |
| Comparative Example b-1 | — | | | |
| Example b-6 | 2,000 | 3:1 | 4.0 | 500 |
| Example b-7 | 3,000 | 2:1 | | |
| Example b-8 | 6,000 | 1:1 | | |
| Example b-9 | 8,000 | 1:1.5 | | |
| Example b-10 | 16,000 | 1:2.7 | | |
| Comparative Example b-2 | — | | | |

TABLE 5

| | Temperature of heat dissipation member [° C.] | | | | Average temperature [° C.] | Temperature difference [° C.] |
|---|---|---|---|---|---|---|
| | No. 1 | No. 2 | No. 3 | No. 4 | | |
| Example b-1 | 59.89 | 58.92 | 59.05 | 58.03 | 58.973 | 1.86 |
| Example b-2 | 57.35 | 56.92 | 57.2 | 56.46 | 56.983 | 0.89 |

TABLE 5-continued

| | Temperature of heat dissipation member [° C.] | | | | Average temperature [° C.] | Temperature difference [° C.] |
|---|---|---|---|---|---|---|
| | No. 1 | No. 2 | No. 3 | No. 4 | | |
| Example b-3 | 56.31 | 57.04 | 57.27 | 56.92 | 56.885 | 0.96 |
| Example b-4 | 56.97 | 57.53 | 58.47 | 58.55 | 57.880 | 1.58 |
| Example b-5 | 59.89 | 60.87 | 62.15 | 63.06 | 61.493 | 3.17 |
| Comparative Example b-1 | 64.1 | 68 | 74.7 | 83.8 | 72.650 | 19.7 |
| Example b-6 | 69.99 | 68.57 | 68.46 | 66.65 | 68.418 | 3.34 |
| Example b-7 | 64.78 | 63.98 | 64.52 | 63.27 | 64.138 | 1.51 |
| Example b-8 | 61.07 | 61.63 | 62 | 61.61 | 61.578 | 0.93 |
| Example b-9 | 61.15 | 61.41 | 62.51 | 62.63 | 61.925 | 1.48 |
| Example b-10 | 64.41 | 65.08 | 66.35 | 66.89 | 65.683 | 2.48 |
| Comparative Example b-2 | 67.6 | 72.1 | 82.8 | 94.1 | 79.150 | 26.5 |

TABLE 6

| | Air speed in gas discharge port [m/s] | | | | Average air speed [m/s] | Air speed difference [m/s] |
|---|---|---|---|---|---|---|
| | No. 1 | No. 2 | No. 3 | No. 4 | | |
| Example b-1 | 5.98 | 5.986 | 5.738 | 6.261 | 5.991 | 0.523 |
| Example b-2 | 6.896 | 6.775 | 6.278 | 6.811 | 6.690 | 0.618 |
| Example b-3 | 7.843 | 7.251 | 6.516 | 6.552 | 7.041 | 1.327 |
| Example b-4 | 8.408 | 7.823 | 6.484 | 6.132 | 7.212 | 2.276 |
| Example b-5 | 9.065 | 8.317 | 7.026 | 5.563 | 7.493 | 3.502 |
| Example b-6 | 3.232 | 3.253 | 3.111 | 3.338 | 3.234 | 0.227 |
| Example b-7 | 4.049 | 4.003 | 3.686 | 3.967 | 3.926 | 0.363 |
| Example b-8 | 5.317 | 5.029 | 4.59 | 4.565 | 4.875 | 0.752 |
| Example b-9 | 5.846 | 5.625 | 4.832 | 4.541 | 5.211 | 1.305 |
| Example b-10 | 6.335 | 6.151 | 5.281 | 4.43 | 5.549 | 1.905 |

As shown in Table 2, in Examples a-1 to a-10 having the inner casing 150 provided with the communication ports 151a and 152a, all of the temperature differences between the respective heat dissipation members 400 were 6° C. or less. In contrast, the temperature differences in Comparative Examples a-1 and a-2 having no inner casing 150 were 17° C. or more and had a numerical value of three or more times the numerical value of the temperature difference in any one of the Examples and the Comparative Examples. In addition, as shown in Table 5, in Examples b-1 to b-10 having the inner casing 150 provided with the communication ports 151a and 152a, all of the temperature differences between the respective heat dissipation members 400 were 4° C. or less. In contrast, the temperature differences in Comparative Examples b-1 and b-2 having no inner casing 150 were 19° C. or more and had a numerical value of four or more times the numerical value of the temperature difference in any one of the Examples and the Comparative Examples. In general, it is considered that if the temperature difference between the multiple LED elements 210 of the light emitting apparatus 1 exceeds 10° C., there is concern that a problem may occur when the light emitting apparatus 1 is actually used, but in the present exemplary embodiment, since the inner casing 150 having the communication ports 151a and 152a1 is provided in the light emitting apparatus, the temperature difference between the respective heat dissipation members 400 may be effectively reduced, and as a result, the multiple LED elements 210 may be cooled so that the problem does not occur in actual use.

From Table 2, when the cross-sectional area of the space β in the Y-Z plane was 4,000 mm², particularly, under the conditions of Examples a-2, a-3, a-4, a-7, a-8, and a-9, the temperature difference between the four heat dissipation members 400 could be 2° C. or less. In addition, from Table 3, when the cross-sectional area of the space β in the Y-Z plane was 4,000 mm², particularly, under the conditions of Examples a-1, a-2, a-3, a-4, a-6, a-7, a-8, and a-9, the air speed difference between the four gas discharge ports 101 could be 2.5 m/s or less. As described above, when the cross-sectional area of the space β in the Y-Z plane was 4,000 mm², a value of the communication port opening area with respect to the cross-sectional area of the space β in the Y-Z plane may be set to 1 or more and less than 4 (Table 1).

From Table 5, when the cross-sectional area of the space β in the Y-Z plane was 6,000 mm², particularly, under the conditions of Examples b-2, b-3, b-4, b-7, b-8, and b-9, the temperature difference between the four heat dissipation members 400 could be 2° C. or less. In addition, from Table 6, when the cross-sectional area of the space β in the Y-Z plane was 6,000 mm², particularly, under the conditions of Examples b-1, b-2, b-3, b-4, b-6, b-7, b-8, and b-9, the air speed difference between the four gas discharge ports 101 could be 2.5 m/s or less. As described above, when the cross-sectional area of the space β in the Y-Z plane was 6,000 mm², a value of the communication port opening area with respect to the cross-sectional area of the space β in the Y-Z plane may be set to 0.5 or more and less than 2.7 (Table 4). In this way, from the results of the simulations shown in Tables 1 to 6, it was revealed that in the present exemplary embodiment, the cooling with higher uniformity could be realized by setting the ratio between the cross-sectional area of the space β in the Y-Z plane and the communication port opening area (opening ratio) to 1:1 to 1:2.

In this way, in the present exemplary embodiment, the light source units 200 and the heat dissipation members 400 are fixed by the inner casing 150, and air flows between the respective heat radiation fins 420 through the communication ports 151a and 152a formed in the two partition plates 151 and 152 of the inner casing 150 which face each other in the Y-axis direction, such that the amounts of air flowing along the respective heat dissipation members 400 are approximately equal to one another (i.e., the air speeds are approximately equal to one another). Further, with the configuration, the four heat dissipation members 400 are uniformly cooled.

As described above, in the present exemplary embodiment, the heat, which is transferred to the heat dissipation member 400 from the light source unit 200, is cooled by the air supplied through the housing 100 and the inner casing 150, and as a result, the housing 100 itself is not heated. Therefore, other components may be disposed near the periphery of the light emitting apparatus 1, and as a result, an overall size of an apparatus including the light emitting apparatus 1 may be reduced.

As illustrated in FIG. 4, in the present exemplary embodiment, a front panel (a member on which the window 105 is mounted) of the housing 100 is also cooled by the air supplied through the portion (i.e., the space β) between the housing 100 and the inner casing 150, such that the respective mirror surfaces 108a and 108b fixed to the front panel are also cooled, and as a result, the respective mirror surfaces 108a and 108b are prevented from being deformed by heat.

While the present exemplary embodiment has been described above, the present invention is not limited to the aforementioned configurations and may be variously modified within the scope of the technical spirit of the present invention.

For example, the light emitting apparatus 1 of the present exemplary embodiment is the apparatus for emitting the ultraviolet ray, but the light emitting apparatus 1 is not limited to the aforementioned configuration, and the present invention may also be applied to apparatuses for emitting irradiation light beams having other wavelength regions (e.g., visible light such as white light, infrared light, etc.).

In the present exemplary embodiment, the configuration in which the LED drive circuits 500 are disposed in the space α in the housing 100 has been described, but the space α is not necessarily required in terms of uniform cooling of the four heat dissipation members 400, and the cooling fan 103 may be disposed near the space β.

In the present exemplary embodiment, the configuration in which the light source units 200 and the heat dissipation members 400 are accommodated in the inner casing 150 has been described, but the inner casing 150 is not necessarily required, and it is acceptable as long as the space α, the space β, and the space γ are formed and the multiple partition plates for controlling the flow of air are provided.

Second Exemplary Embodiment

Figure 5:
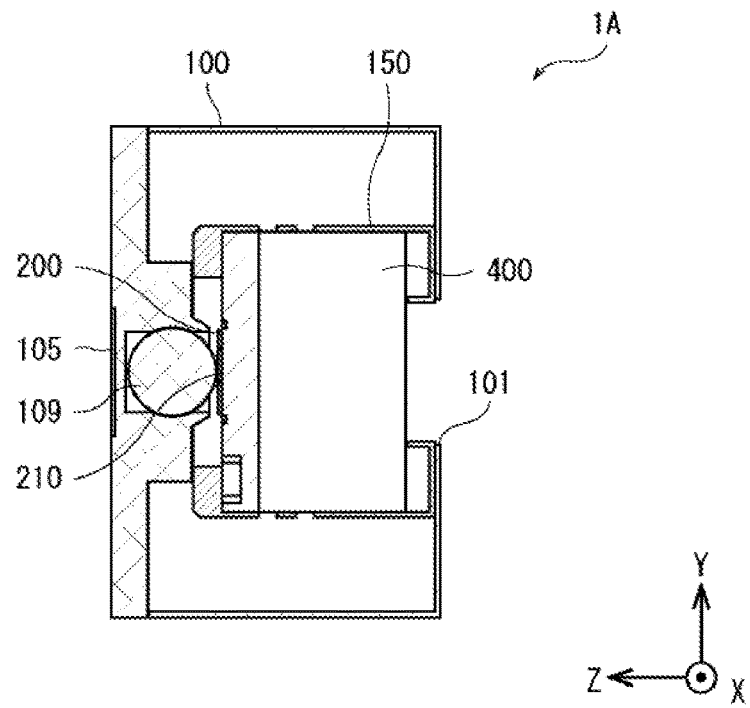
FIG. 5 is a view for explaining an internal configuration of a light emitting apparatus according to a second exemplary embodiment of the present invention.

FIG. 5 is a cross-sectional view for explaining an internal configuration of a light emitting apparatus 1A according to a second exemplary embodiment of the present invention. As illustrated in FIG. 5, the light emitting apparatus 1A of the present exemplary embodiment differs from the light emitting apparatus 1 of the first exemplary embodiment in that instead of the reflective member 108, a columnar lens 109, which extends in the X-axis direction, is provided on the optical path of the respective LED elements 210. In this way, when the columnar lens 109 is disposed on the optical path of the LED element 210, a spread angle in the Y-axis direction of the ultraviolet ray emitted from the respective LED elements 210 is narrowed, and as a result, it is possible to emit the ultraviolet ray having higher peak intensity to a desired irradiation region.

Third Exemplary Embodiment

Figure 6:
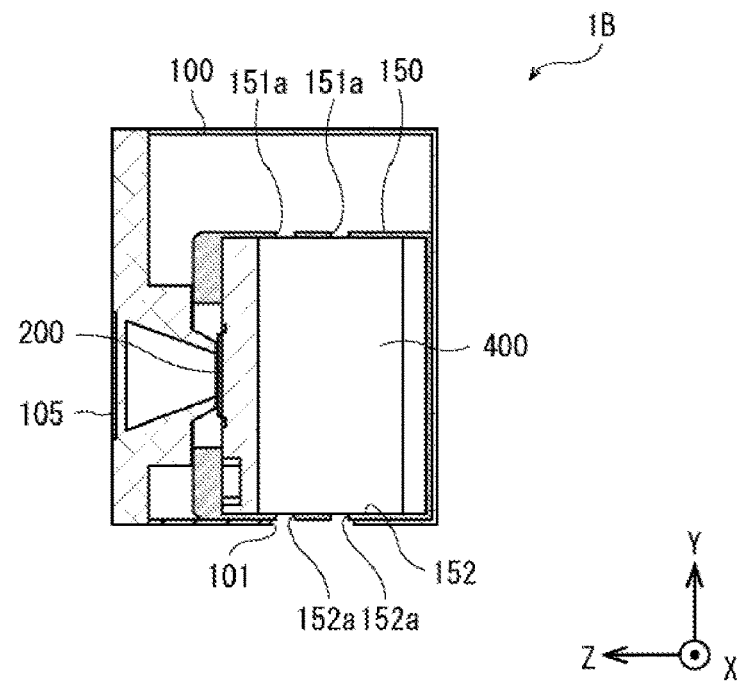
FIG. 6 is a view for explaining an internal configuration of a light emitting apparatus according to a third exemplary embodiment of the present invention.

FIG. 6 is a cross-sectional view for explaining an internal configuration of a light emitting apparatus 1B according to a third exemplary embodiment of the present invention. As illustrated in FIG. 6, the light emitting apparatus 1B of the present exemplary embodiment differs from the light emitting apparatus 1 of the first exemplary embodiment in that the partition plate 152 of the inner casing 150 is in contact with the housing 100 and the gas discharge port 101 is disposed to be in communication with the communication port 152a. In this way, in the case in which the light emitting apparatus 1B is configured such that the air in the housing 100 is discharged from the communication port 152a at one side, it is possible to discharge the air in the direction opposite to the Y-axis direction. That is, it is possible to change the air discharge direction.

Fourth Exemplary Embodiment

Figure 7:
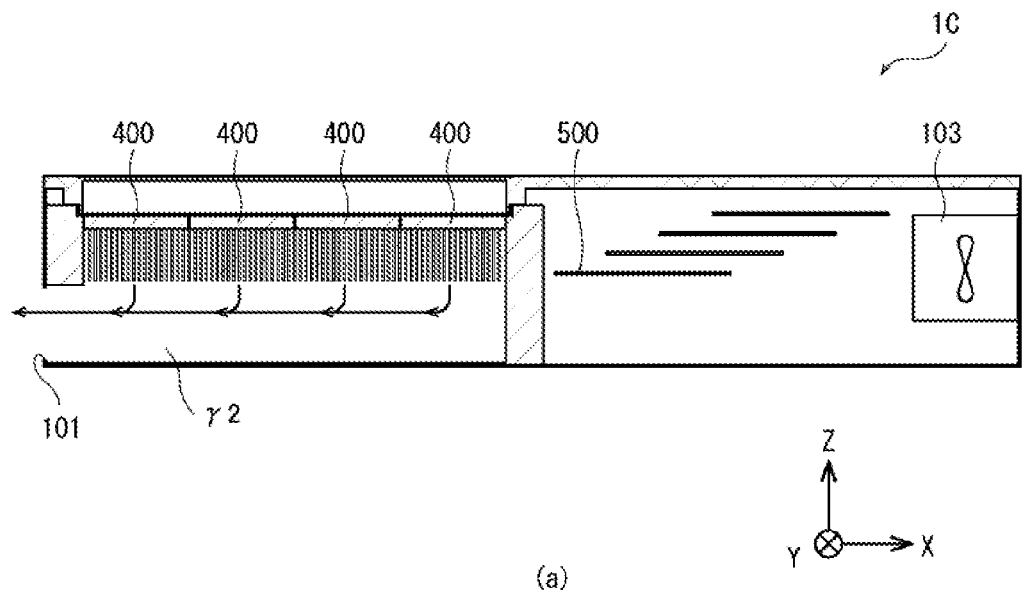
FIG. 7 is a view for explaining an internal configuration of a light emitting apparatus according to a fourth exemplary embodiment of the present invention.
Figure 7:
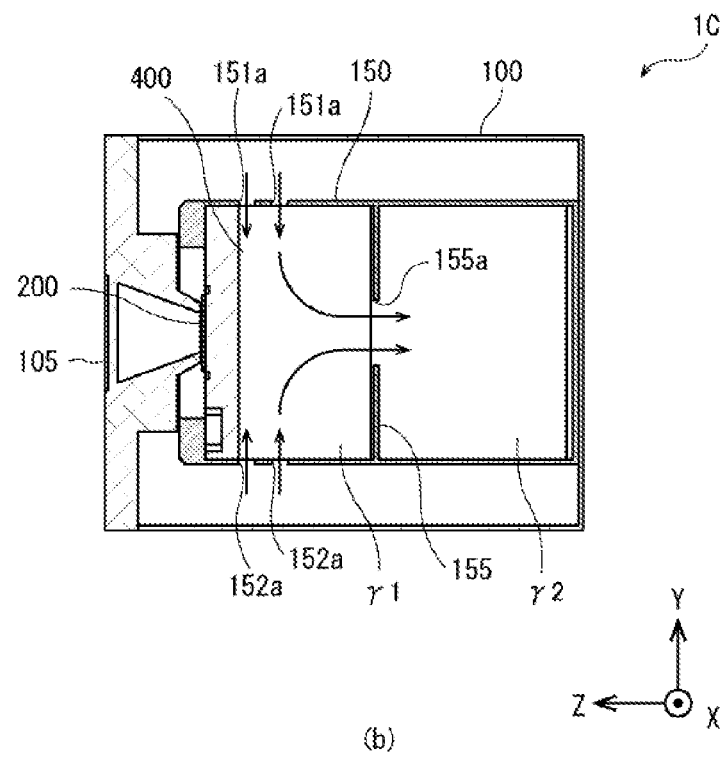

FIG. 7 is a cross-sectional view for explaining an internal configuration of a light emitting apparatus 1C according to a fourth exemplary embodiment of the present invention, FIG. 7A is a view corresponding to FIG. 2B of the first exemplary embodiment, and FIG. 7B is a view corresponding to FIG. 2A of the first exemplary embodiment. As illustrated in FIG. 7, the light emitting apparatus 1C of the present exemplary embodiment differs from the light emitting apparatus 1 of the first exemplary embodiment in that the interior of the inner casing 150 is partitioned into a space γ1 (first sub-space) and a space γ2 (second sub-space) by a partition plate 155, the light source units 200 and the heat dissipation members 400 are accommodated in the space γ1, air introduced into the space γ1 moves into the space γ2 through a through hole 155a formed in the partition plate 155, and air introduced into the space γ2 is discharged from the gas discharge port 101 formed in a wall surface of the housing 100 which is opposite to the cooling fan 103. According to this configuration, the light emitting apparatus 1C has the same operational effect as the light emitting apparatus 1 of the first exemplary embodiment and may discharge the air in the housing 100 in the direction opposite to the X-axis direction. That is, it is possible to change the air discharge direction.

It should be understood that all of the exemplary embodiments disclosed herein are illustrative but not restrictive. The scope of the present invention is represented by the appended claims instead of the above description, and all the changes derived within the equivalent meaning and the scope of the claims are intended to fall within the scope of the present invention.

What is claimed is:

1. A light emitting apparatus which emits, onto an irradiation surface, linear light that extends in a first direction and has a predetermined line width in a second direction orthogonal to the first direction, the light emitting apparatus comprising:

a light source unit which has a substrate that extends in the first direction, and multiple light sources that are disposed on a surface of the substrate in parallel in the first direction;

a heat dissipation unit which has multiple heat radiation fins that are formed at predetermined intervals in the first direction, and is thermally coupled to a rear side of the substrate;

a partition plate which forms a first air channel surrounding the multiple heat radiation fins;

a housing which accommodates the light source unit, the heat dissipation unit, and the partition plate and forms a second air channel between the housing and the partition plate; and a cooling fan which receives air from the outside, guides the air to the second air channel, and forms an airflow in the first direction in the second air channel, wherein the partition plate has a communication port formed to be in communication with the first air channel and the second air channel, the housing continues from the first air channel and has a gas discharge port through which the air in the first air channel is discharged to the outside, and the air, which is guided in the first direction in the second air channel, is guided into the first air channel through the communication port, passes between the multiple heat radiation fins, and is discharged to the outside from the gas discharge port.

2. The light emitting apparatus according to claim 1, wherein the housing has, between the second air channel and the cooling fan, a third air channel which is in communication with the second air channel.

3. The light emitting apparatus according to claim 2, wherein a drive circuit, which is electrically connected to the light source unit and supplies electric power to the multiple light sources, is provided in the third air channel.

4. The light emitting apparatus according to claim 1, further comprising:
a reflective member which guides the light, which is emitted from the multiple light sources, to the outside of the housing,
wherein the reflective member is thermally coupled to a part of the housing, and the part of the housing forms a part of the second air channel.

5. The light emitting apparatus according to claim 1, wherein a ratio between a cross-sectional area of the second air channel in the second direction and an opening area of the communication port is set to 1:1 to 1:2.

6. The light emitting apparatus according to claim 1, wherein an opening area of the gas discharge port is larger than the opening area of the communication port.

7. The light emitting apparatus according to claim 1, wherein the gas discharge port is provided in a wall portion of the housing which is positioned in a direction opposite to an emission direction of light emitted from the multiple light sources.

8. The light emitting apparatus according to claim 1, wherein the gas discharge port is formed in a wall portion of the housing which is positioned in the second direction.

9. The light emitting apparatus according to claim 1, wherein the gas discharge port is provided in a wall portion of the housing which is orthogonal to the first direction.

10. The light emitting apparatus according to claim 9, wherein the first air channel is partitioned into a first sub-space which is formed in the first direction and at least accommodates the heat dissipation unit, and a second sub-space which is positioned in parallel with the first sub-space in a direction opposite to the emission direction of the light emitted from the multiple light sources and is in communication with the first sub-space and the gas discharge port.

11. The light emitting apparatus according to claim 1, wherein the light is light including a wavelength acting on ultraviolet curable resin.

* * * * *